(12) United States Patent
Razdan et al.

(10) Patent No.: US 11,181,689 B2
(45) Date of Patent: Nov. 23, 2021

(54) LOW TEMPERATURE SOLDER IN A PHOTONIC DEVICE

(71) Applicant: Cisco Technology, Inc., San Jose, CA (US)

(72) Inventors: Sandeep Razdan, Burlingame, CA (US); Vipulkumar K. Patel, Breinigsville, PA (US); Aparna R. Prasad, San Jose, CA (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 16/579,330

(22) Filed: Sep. 23, 2019

(65) Prior Publication Data

US 2021/0088722 A1    Mar. 25, 2021

(51) Int. Cl.
| | |
|---|---|
| *G02B 6/12* | (2006.01) |
| *G02B 6/13* | (2006.01) |
| *B23K 35/26* | (2006.01) |
| *H01L 23/00* | (2006.01) |

(52) U.S. Cl.
CPC ........ *G02B 6/12004* (2013.01); *B23K 35/262* (2013.01); *B23K 35/264* (2013.01); *G02B 6/13* (2013.01); *H01L 24/13* (2013.01); *H01L 24/16* (2013.01); *H01L 24/81* (2013.01); *G02B 2006/12121* (2013.01); *H01L 2224/13209* (2013.01); *H01L 2224/13211* (2013.01); *H01L 2224/13213* (2013.01); *H01L 2224/13239* (2013.01); *H01L 2224/16227* (2013.01); *H01L 2224/81815* (2013.01); *H01L 2924/014* (2013.01); *H01L 2924/0105* (2013.01); *H01L 2924/01047* (2013.01); *H01L 2924/01049* (2013.01); *H01L 2924/01083* (2013.01)

(58) Field of Classification Search
None
See application file for complete search history.

(56) References Cited

U.S. PATENT DOCUMENTS

| | | | |
|---|---|---|---|
| 6,524,017 B2 * | 2/2003 | Lecocq ............... | G02B 6/4212 257/431 |
| 6,570,029 B2 * | 5/2003 | Wang .................. | C07D 303/16 257/E21.503 |
| 6,773,169 B2 * | 8/2004 | Ebeling ............... | G02B 6/4212 385/52 |
| 7,111,992 B2 * | 9/2006 | Kaneko ................ | G02B 6/262 385/39 |
| 7,256,059 B2 * | 8/2007 | Lu ....................... | G02B 6/4214 257/E21.503 |

(Continued)

OTHER PUBLICATIONS

U.S. Appl. No. 15/961,163, filed Apr. 24, 2018.

(Continued)

*Primary Examiner* — Rhonda S Peace
(74) *Attorney, Agent, or Firm* — Patterson + Shendan, LLP (57) ABSTRACT

Photonic devices include a photonic assembly and a substrate coupled to the photonic assembly. The photonic assembly includes a photonic die and an optical device coupled to the photonic die with an adhesive to form an optical connection between the optical device and the photonic die. The photonic assembly is coupled to the photonic assembly by reflowing a plurality of solder connections at temperature that is less than a cure temperature of the adhesive.

20 Claims, 6 Drawing Sheets

(56) References Cited

U.S. PATENT DOCUMENTS

| | | | |
|---|---|---|---|
| 9,964,719 B1 | 5/2018 | Razdan et al. | |
| 10,261,249 B2* | 4/2019 | Kainuma | G02B 6/122 |
| 10,598,875 B2* | 3/2020 | Xie | H01L 33/54 |
| 2002/0009869 A1 | 1/2002 | Cotte et al. | |
| 2002/0094146 A1 | 7/2002 | Yamaguchi | |
| 2003/0132271 A1* | 7/2003 | Kao | H05K 3/3463 |
| | | | 228/180.22 |
| 2003/0155402 A1* | 8/2003 | Yeh | B23K 35/26 |
| | | | 228/56.1 |
| 2004/0100781 A1* | 5/2004 | Bozso | G02B 6/12004 |
| | | | 361/767 |
| 2006/0062522 A1* | 3/2006 | Lee | G02B 6/4232 |
| | | | 385/49 |
| 2007/0080451 A1* | 4/2007 | Suh | H01L 24/16 |
| | | | 257/737 |
| 2007/0206649 A1* | 9/2007 | Xu | H01S 5/02212 |
| | | | 372/38.02 |

OTHER PUBLICATIONS

U.S. Appl. No. 16/544,699, filed Aug. 19, 2019.
PCT Notification of Transmittal of the International Search Report and the Written Opinion of the International Searching Authority, or the Declaration for Application No. PCT/US2020/051767 dated Nov. 13, 2020.

* cited by examiner

LOW TEMPERATURE SOLDER IN A PHOTONIC DEVICE

TECHNICAL FIELD

Embodiments presented in this disclosure generally relate to forming photonic devices. More specifically, embodiments disclosed herein the utilization of a low temperature solder to form a photonic device.

BACKGROUND

Photonic devices are used to transmit and receive optical signals within an optical communication system. The photonic devices may be formed by attaching a photonic assembly, having one or more optical devices (e.g., a fiber array and/or a laser) and photonic dies, to a substrate. The optical devices are coupled to the photonic dies using an adhesive and the photonic dies are coupled to the substrate by reflowing solder connections.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate typical embodiments and are therefore not to be considered limiting; other equally effective embodiments are contemplated.

To facilitate understanding, identical reference numerals have been used, where possible, to designate identical elements that are common to the figures. It is contemplated that elements disclosed in one embodiment may be beneficially used in other embodiments without specific recitation.

DESCRIPTION OF EXAMPLE EMBODIMENTS

Overview

In many instances, the reflow temperature of the solder connections is higher than the cure temperature of the adhesive, thus the optical devices are attached to the photonic dies after the photonic dies are attached to the substrate. In such instances, the electrical and optical performance of the photonic assemblies are not able to be tested until after both a photonic die are coupled to the substrate and the optical device(s) are attached to the photonic die. Accordingly, if any electrical or optical performance issues are found during testing, the entire photonic device is scrapped, leading to increased production cost and lower production yields.

One embodiment presented in this disclosure describes a method for forming a photonic device comprises forming a photonic assembly and attaching the photonic assembly to a substrate. The photonic assembly is formed by attaching an optical device to a photonic die with an adhesive to form an optical connection between the optical assembly and the photonic die. Further, the photonic assembly is attached to the substrate by reflowing one or more solder connections formed between the photonic assembly and the substrate. Additionally, the reflow temperature of the one or more solder connections is less than a cure temperature of the adhesive.

One embodiment presented in this disclosure describes a photonic device including a photonic assembly coupled to a substrate coupled. The photonic assembly includes an optical device coupled to a photonic die with an adhesive to form an optical connection between the optical device and the photonic die. The photonic assembly further includes a plurality of solder connections having a reflow temperature that is less than a cure temperature of the adhesive.

One embodiment presented in this disclosure describes a photonic assembly. The photonic assembly includes a photonic die and an optical device coupled to the photonic die with an adhesive. The adhesive forms an optical connection between the optical device and the photonic die. The photonic assembly further includes a plurality of solder connections having a reflow temperature that is less than a cure temperature of the adhesive.

Example Embodiments

In various embodiments, a photonic device is formed by attaching one or more optical devices to a photonic die before the photonic die is attached to a substrate. The optical devices are attached to the photonic die using an adhesive having a cure temperature that is higher than the reflow temperature of the solder connections formed between the photonic die and the substrate. In such embodiments, the electrical and/or optical connections between the optical device or devices and the photonic die may be tested before the photonic die is attached to the substrate as the adhesive is not negatively affected by a solder reflow process. For example, utilizing solder connections having a reflow temperature that is less than the cure temperature of the adhesive ensures that the cured adhesive does not weaken during the reflow process and proper alignment between the optical devices and the photonic die is maintained. Accordingly, damage of the electrical and/or optical connections between the optical devices and the photonic die is mitigated. Further, as the photonic assemblies may be tested before they are attached to a substrate, faulty photonic assemblies may be identified and discarded before formation of the photonic device, increasing the production yield rate and reduced production costs.

Figure 1:
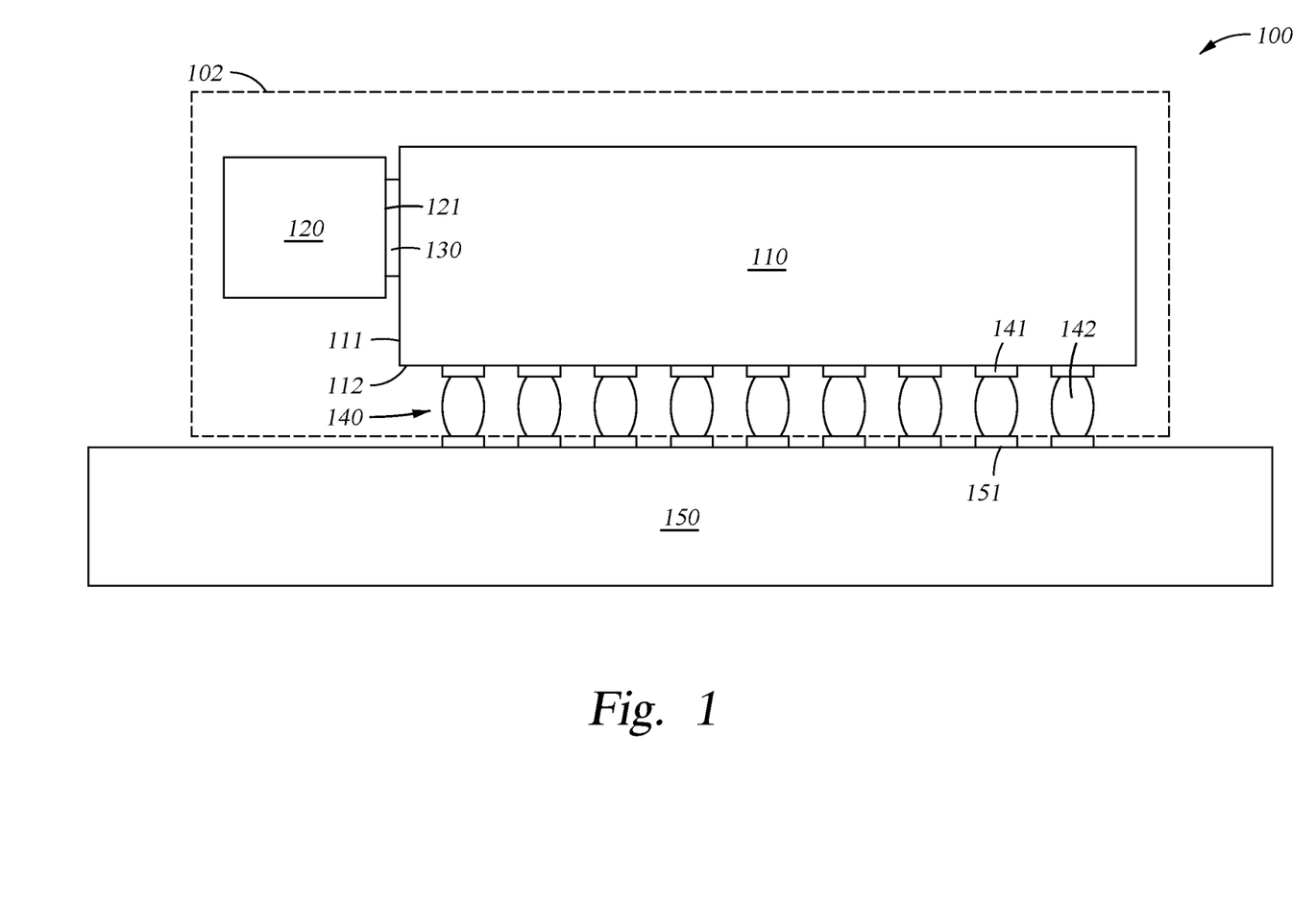
FIG. 1 is a schematic illustration of a photonic device, according to one or more embodiments.

FIG. 1 illustrates photonic device 100, according to one or more embodiments. The photonic device 100 includes a photonic assembly 102 coupled to the substrate 150. In various embodiments, the photonic device 100 may be referred to as a photonic optical engine. For example, the photonic device 100 may be a transceiver of a fiber optic system. In one or more embodiments, the photonic device 100 may at least one of transmit optical signals or receive optical signals. Further, the photonic device 100 may convert optical signals to electrical signals and/or electrical signals to optical signals.

The photonic assembly 102 includes an optical device 120, a photonic die 110, and solder connections 140. The optical device 120 is coupled to the photonic die 110 via an adhesive 130. The adhesive 130 forms an optical connection between the optical device 120 and the photonic die 110. In one embodiment, the adhesive 130 is disposed on at least at least a portion of surface 121 of the optical device 120 and/or at least a portion of the surface 111 of the photonic die 110. The adhesive 130 may have a cure temperature that is less than or equal to about 160 degrees Celsius. In other embodiments, the adhesive 130 may have a cure temperature in a range of about 120 degrees Celsius to about 160 degrees Celsius. Further, the adhesive 130 may have a cure temperature that is less than about 120 degrees Celsius or greater than about 160 degrees Celsius. The adhesive 130 may be an ultraviolet (UV) curable adhesive. Alternatively, the adhesive 130 may be a visible light curable adhesive. Additionally, the adhesive 130 may be an optically clear adhesive. Further, the adhesive 130 may be one or more of a high strength optical adhesive, low stress optical adhesive, a solvent free adhesive, a low shrinkage adhesive, an adhesive having low outgassing properties, and a one component adhesive. Additionally, the adhesive 130 may comprise a gel viscosity. Additionally, or alternatively, the adhesive 130 may comprise a medium viscosity and capable of filling gaps between the optical device 120 and the photonic die 110. Further, the adhesive 130 may have a refractive index of about 1.4 or less. Alternatively, the refractive index of the adhesive 130 may be greater than about 1.4. For example, the refractive index of the adhesive 130 may be about 1.6. However, adhesives having a refractive index greater than 1.6 may be utilized.

The optical device 120 provides a pathway for optical signals to be transmitted to and/or from the photonic device 100. In one or more embodiments, the optical device 120 may be an optical fiber array that includes one or more optical fibers. Further, the optical fiber array may be a one dimensional array or a two dimensional array.

In one or more embodiments, the photonic die 110 comprises a semiconductor substrate on which are disposed any number of optical elements (e.g., optical modulators, waveguides, amplifiers, and the like). For example, the photonic die 110 may convert optical signals to electrical signals, modulate the optical signals, demodulate optical signals, and/or convert electrical signals to optical signals, among others. In one embodiment, the photonic die 110 includes optical couplers to transmit and/or receive optical signals from the optical device 120.

The solder connections 140 are formed on surface 112 of the photonic die 110. The solder connections 140 include input/output (I/O) pads 141 and solder bumps 142. In one embodiment, forming the solder connections comprises forming the I/O pads 141 on the surface 112 of the photonic die 110. The I/O pads 141 may be part of a Redistribution Layer (RDL) of the photonic die 110. The I/O pads 141 may be formed according to various photolithography processes and a metallization process. An example metallization process is Under Bump Metallization; however, in other embodiments, other metallization processes may be utilized to form the I/O pads 141.

The solder bumps 142 of the solder connections 140 are formed on the I/O pads 141. Further, the solder bumps 142 are reflowed to from electrical and mechanical connections between the photonic die 110 and the substrate 150. In one embodiment, the reflow temperature of the solder bumps 142 is less than the cure temperature of the adhesive 130. For example, the reflow temperature of the solder bumps 142 is less than 160 degrees Celsius. However, in other embodiments, the reflow temperature of the solder bumps 142 may be greater than 160 degrees as long as the reflow temperature is less than the cure temperature of the adhesive 130. The solder bumps 142 may be formed from various types of solder. In one or more embodiments, the solder bumps 142 are formed from one or more of indium (IN), tin (SN), silver (Ag), and bismuth (Bi), among others. For example, the solder bumps 142 may be formed from In49Sn, SnIn52, In, SnBi58, In-3Ag, In90Sn10, or In67Bi, among others.

The substrate 150 is coupled to the photonic assembly 102 via the solder connections 140 and includes I/O pads 151. The I/O pads 151 are coupled to the I/O pads 141 of the photonic die 110 via corresponding ones of the solder bumps 142. In one or more embodiments, the substrate 150 may be a printed circuit board (PCB).

In many implementations, the reflow temperature of conventional solder bumps is greater than the cure temperature of the adhesive utilized to couple an optical device to a photonic die. Accordingly, the optical device is commonly coupled to the photonic die after the photonic die is coupled to the substrate. However, if a failure of the photonic assembly is detected after the photonic die is coupled to the substrate 150; the entire photonic device is deemed unusable and scrapped. However, employing solder bumps (e.g., the solder bumps 142) having a reflow temperature that is less than the cure temperature of the adhesive (e.g., the adhesive 130) prevents the adhesive from weakening during the reflow process. Accordingly, movement of the optical device (e.g., the optical device 120) relative to the photonic die (e.g., the photonic die 110) is mitigated and any misalignment between the optical device and the photonic die may be avoided. In one embodiment, employing solder bumps having a reflow temperature that is less than the cure temperature of the adhesive allows optical device to be attached to the photonic die before the photonic die is coupled to the substrate (e.g., the substrate 150). Accordingly, the corresponding photonic assembly may be electrically tested and/or optically tested before being coupled to the substrate. Hence, a photonic assembly having one or more electrical or optical faults may be identified before integration with the substrate and the faulty photonic assembly may be scrapped instead of the entire photonic device. As such, the malfunctioning photonic assemblies may be removed from production before being coupled to the substrate 150, decreasing the failure rate of the corresponding photonic devices and increasing the production yield.

Figure 2:
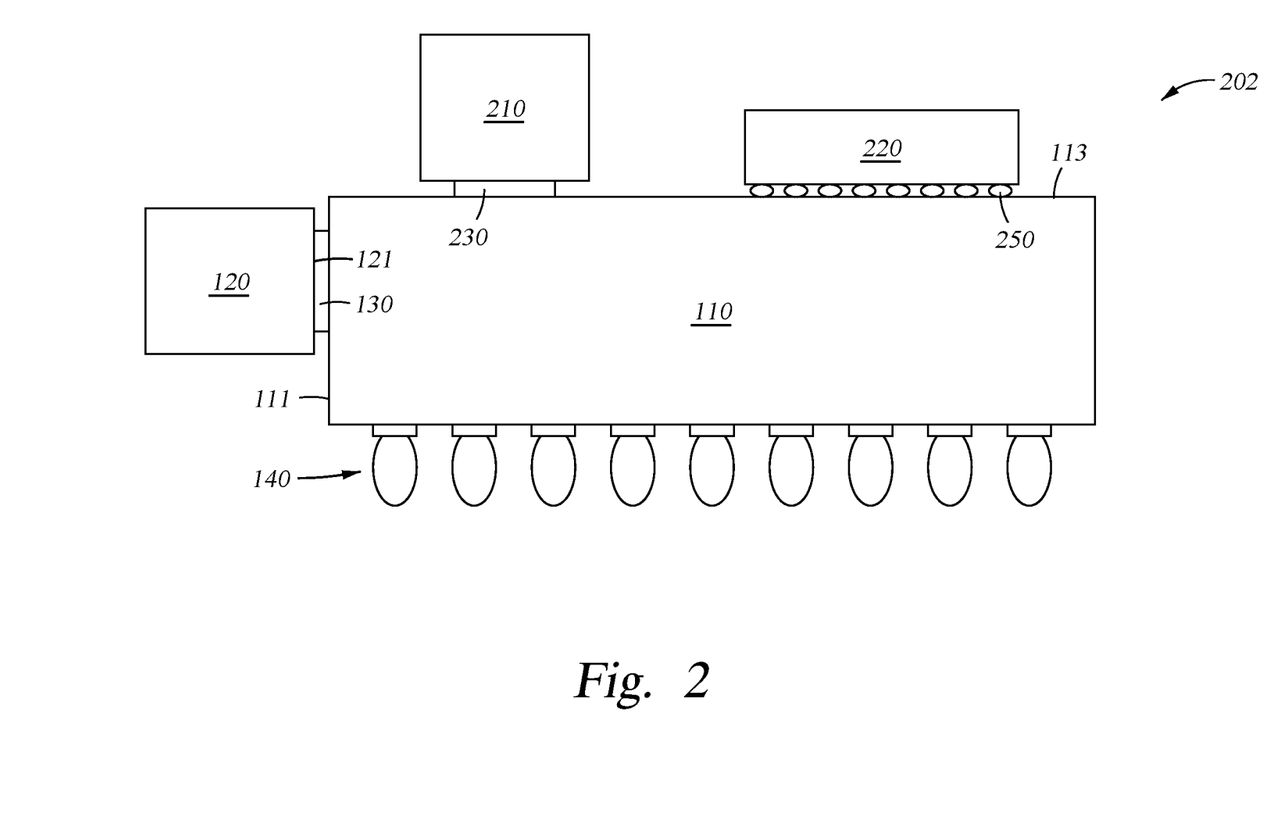
FIG. 2 is a schematic illustration of a photonic assembly, according to one or more embodiments.

FIG. 2 illustrates a photonic assembly 202, according to one or more embodiments. The photonic assembly 202 and the photonic assembly 102 are configured similarly to each other. As compared to the photonic assembly 102, the photonic assembly 202 additionally includes the optical device 210 and an electric integrated circuit (IC) (EIC) 220. The optical device 210 may be a laser, photodiode, lens, prism, isolator, and an optical multiplexer/demultiplexer (MUX/DMUX) device, among others. In various embodiments, the photonic assembly 202 may include more than one optical device 210. For example, the photonic assembly 202 may include a laser and a lens. However, in other embodiments, the photonic assembly 202 may include other combinations of optical devices. The optical device 210 may be coupled to an optical interface of the photonic die 110 via the solder 230.

The EIC 220 is coupled to the surface 113 of the photonic die 110 via connections 250. The connections 250 may be solder connections and coupling the EIC 220 to the surface 113 of the photonic die 110 may include reflowing the solder connections of the connections 250. As the connections 250 may be reflowed before the optical device 120 is attached to the optical device 120, the reflow temperature of the connections 250 may exceed the cure temperature of the adhesive 130 and the reflow temperature of the connections 140.

In other embodiments, the reflow temperature of the connections 250 may be less than the cure temperature of the adhesive 130.

In various embodiments, the EIC 220 processes and/or generates electrical signals. For example, the EIC 220 may process analog and/or digital signals transmitted from the photonic assembly 202. Additionally, or alternatively, the EIC 220 may process analog and/or digital signals received by the photonic assembly 202. In one embodiment, the EIC 220 generates control signals for modulating optical signals in the optical device 210. Further, the EIC 220 may analyze electrical signals based on received optical signals, communicate electrical signals based on received optical signals to other circuits, and/or provide power to the photonic die 110 for the analysis or conversion of optical signals to or form electrical signals. In various embodiments, the EIC 220 may be omitted and the functions of the EIC 220 may be performed by the photonic die 110.

Figure 3:
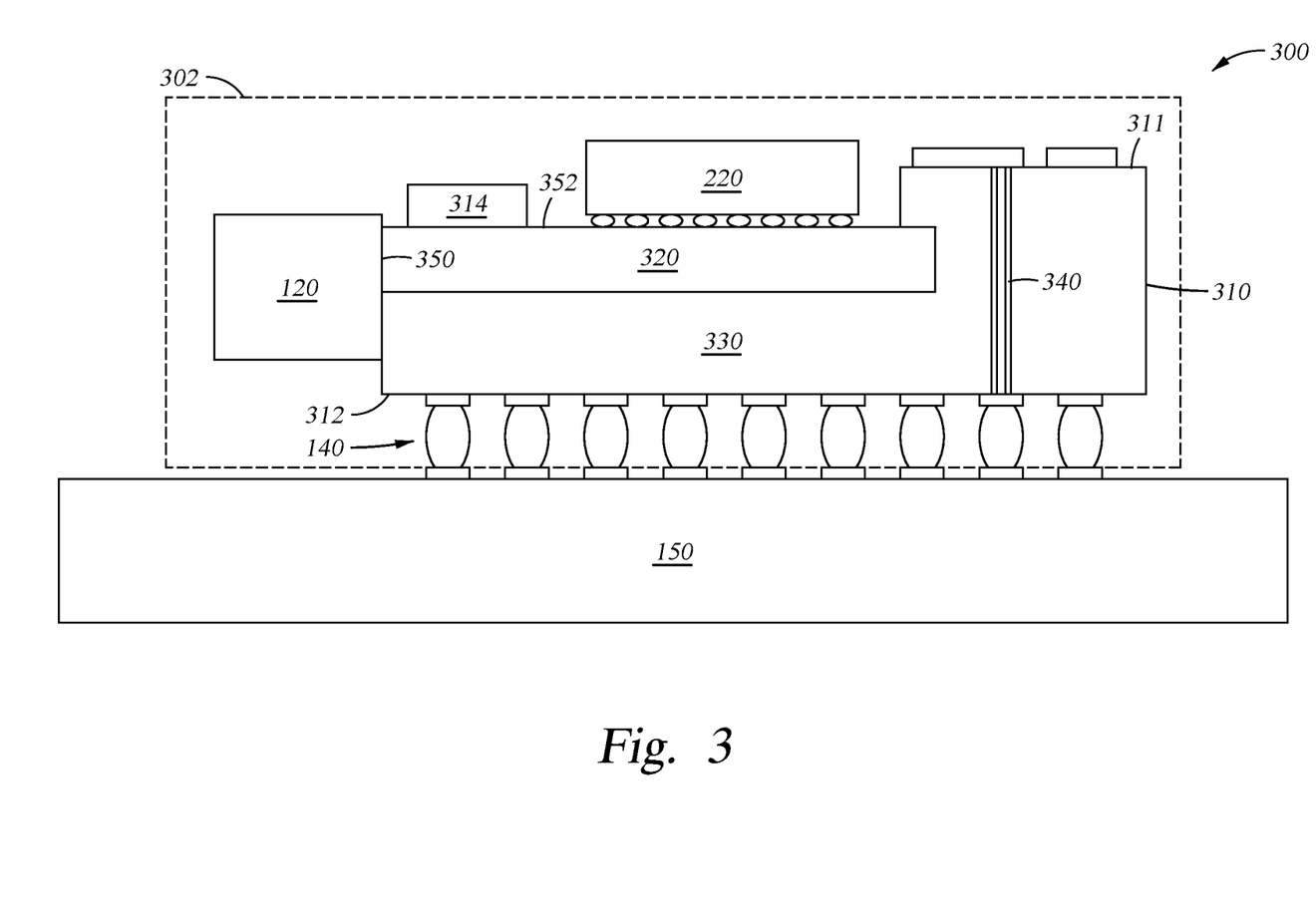
FIGS. 3 and 4 are schematic illustrations of a photonic device, according to one or more embodiments.

FIG. 3 illustrates a photonic device 300, according to one or more embodiments. The photonic device 300 is configured similar to that of the photonic device 100. As illustrated, the photonic device 300 includes the photonic assembly 302 and the substrate 150.

The photonic assembly 302 includes a photonic die 310, the optical device 120 and the solder connections 140. The photonic assembly 302 may also include one or more of the laser 314 and the EIC 220. The photonic die 310 includes a Photonic IC (PIC) 320 embedded within mold compound 330. Further, one or more vias 340 may be embedded within the mold compound 330. In various embodiments, one or more interposers may also be embedded within the mold compound 330. Further, the photonic assembly 302 may include one or more passive components.

As is described in greater detail with regard to FIG. 1, the photonic assembly 302 is coupled to the substrate 150 via the solder connections 140. The photonic die 310 may be part of a larger wafer, on which one or more optical devices are attached. After the optical devices are attached, the wafer may be diced to form individual photonic assemblies (e.g., photonic assembly 302).

In one or more embodiments, the EIC 220 is coupled to the PIC 320. The PIC 320 may perform one or more of the functions described above with regard to the photonic die 110. In various embodiments, the PIC 320 provides an optical interface to send and/or receive optical signals to and/or from the photonic assembly 302. Further the mold compound 330 may be any epoxy or substrate used to fabricate a reconstituted wafer.

The one or more vias 340 provide electrical pathways between the surface 312 (e.g., bottom surface) of the photonic assembly 302 and the surface 311 (e.g., top surface) of the photonic assembly 302. For example, the one or more vias 340 allow electrical signals to be communicated between the surface 311 and the surface 312.

In various embodiments, the optical device 120 is coupled to the photonic die 310 via an adhesive (e.g., adhesive 130) at interface 350. Further, the laser 314 may be coupled to the photonic die via a solder (e.g., solder 230) at interface 352.

Figure 4:
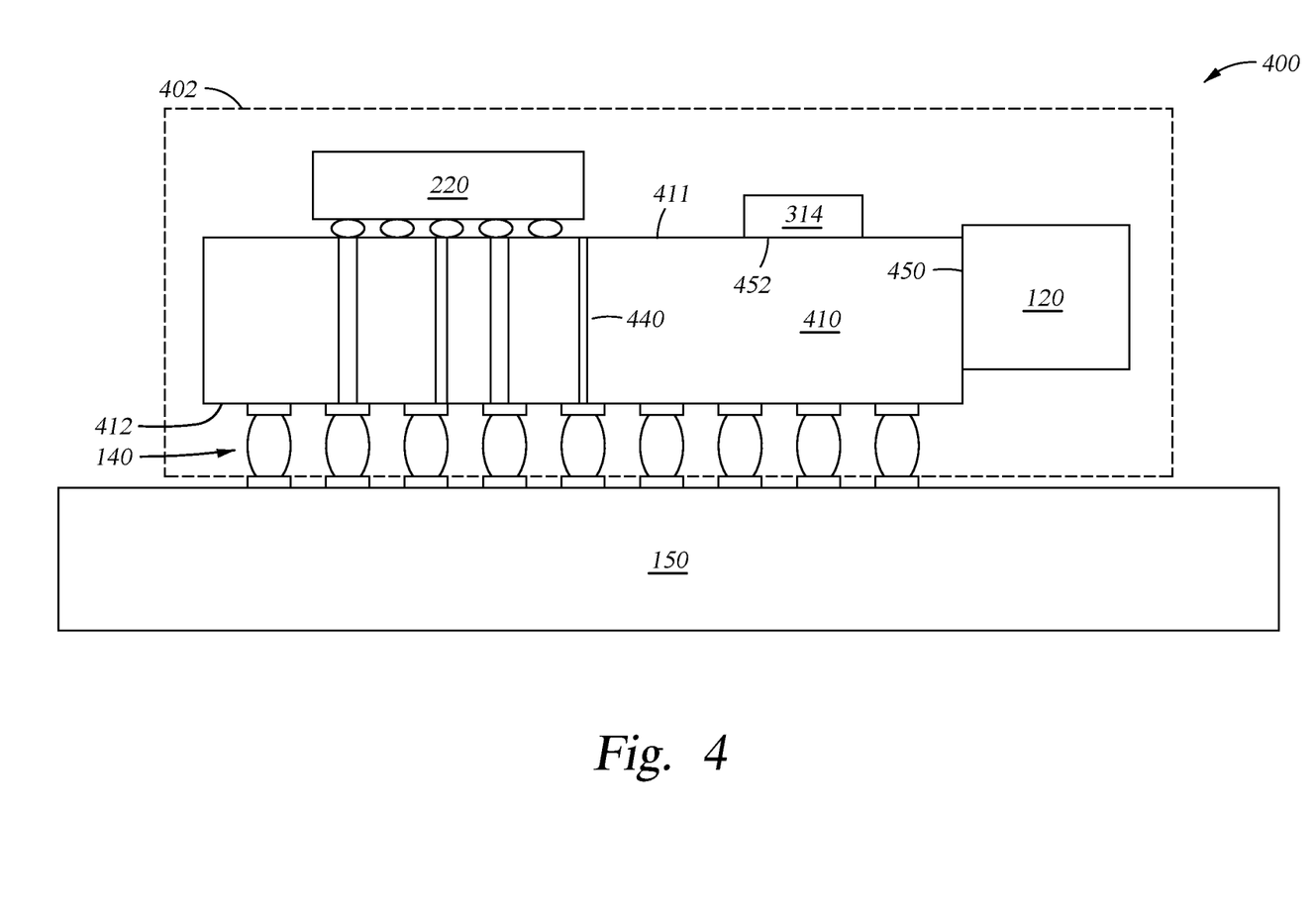

FIG. 4 illustrates a photonic device 400, according to one or more embodiments. The photonic device 400 is configured similar to that of the photonic device 100. As illustrated, the photonic device 400 includes the photonic assembly 402 and the substrate 150.

The photonic assembly 402 includes a photonic die 410 and the optical device 120. In one or more embodiments, the photonic assembly 402 additionally includes one or more of the laser 314 and the EIC 220. In various embodiments, the optical device 120 is coupled to the photonic die 310 via an adhesive (e.g., adhesive 130) at interface 450. Further, the laser 314 may be coupled to the photonic die via solder (e.g., solder 230) at interface 452. The solder 230 may be a gold tin (AuSn) Eutectic solder. Further, the solder 230 may have a Eutectic temperature of 280 degrees Celsius. Alternatively, the solder 230 may be formed from other alloys having other reflow temperatures.

The photonic die 410 is configured similar to the photonic die 110. For example, the photonic die 410 may include one or more IC elements configured to perform the function described with regard to the photonic dies 110. In various embodiments, the photonic die 410 additionally includes one or more vias 440. The one or more vias 440 provide electrical pathways (e.g., through silicon vias (TSVs)) between the surface 412 and the surface 411 of the photonic die 410. For example, the one or more vias 440 may communicate electrical signals from the surface 412 and the surface 411 of the photonic die 410.

Figure 5:
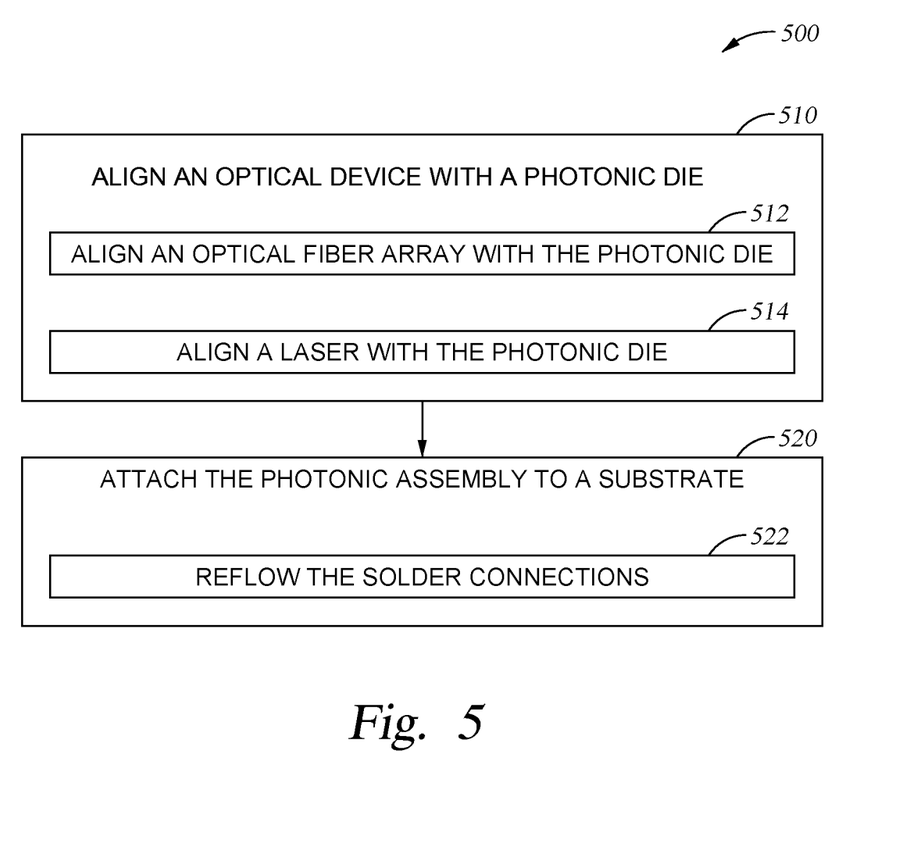
FIG. 5 is a flow chart of a method of forming a photonic device, according to one or more embodiments.

FIG. 5 is a flow chart of method 500 for forming a photonic device, according to one or more embodiments. At operation 510, the optical device 120 is connected to the photonic die 110. In one embodiment, the optical device 120 is connected the photonic die 110 via the adhesive 130. The adhesive 130 may be disposed on at least a portion of the surface 121 of the optical device and/or at least a portion of the surface 111 of the photonic die 110. In one embodiment, the adhesive 130 forms an optical connection between the optical device 120 and the photonic die 110. In various embodiments, the adhesive 130 forms a mechanical connection between the optical device 120 and the photonic die 110. In one or more embodiments, the adhesive 130 may be part of the optical connection (e.g., optical signal travel through the adhesive). Further, in one or more embodiments, attaching the optical device 120 to the photonic die 110 comprises aligning an optical source (e.g., a fiber array) with the photonic die 110 (operation 512). Further, a second optical device (e.g., the optical device 210) may be aligned with the photonic die 110 at operation 514. In various embodiments, the second optical device is attached to the photonic die 110 via the solder 230. Further, the second optical device is one of a laser, photodiode, lens, prism, isolator, and an optical MUX/DMUX device, among others. In any case, the adhesive maintains the alignment by established a mechanical connection between the photonic die 110 and the optical device 120.

At operation 520, a photonic assembly (e.g., the photonic assembly 102, 202, 302, or 402) is attached to the substrate 150. For example, the photonic assembly may be attached to the substrate 150 via the solder connections 140. Attaching the photonic assembly to the substrate 150 via the solder connections 140 comprises reflowing the solder connections 140 as shown in operation 522. The solder connections 140 are reflowed at a temperature less than the cure temperature of the adhesive 130. For example, the solder connections 140 comprise solder bumps 142 that are formed of a solder that has a reflow temperature that is less than the cure temperature of the adhesive 130. In one embodiment, the solder connections are reflowed at a temperature less than about 160 degrees Celsius.

Figure 6:
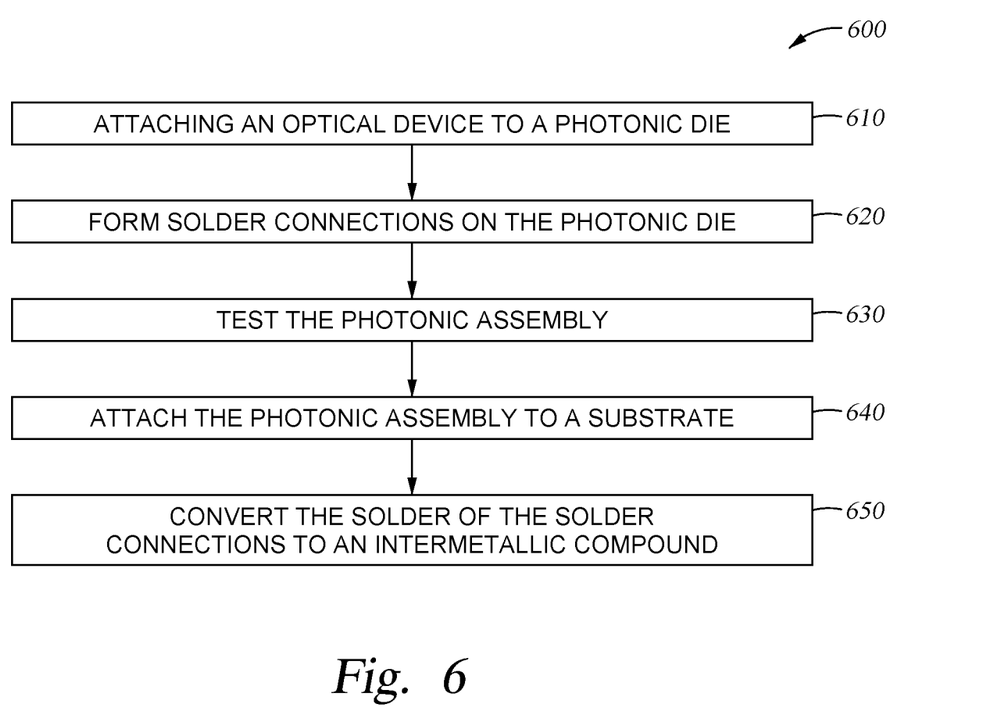
FIG. 6 is a flow chart of a method of forming a photonic device, according to one or more embodiments.

FIG. 6 is a flow chart of a method 600 for forming a photonic device, according to one or more embodiments. At operation 610, the optical device 120 is attached to the photonic die 110, forming a photonic assembly (e.g., the photonic assembly 102, 202, 302, or 402). The operation 610 is similar to that of operation 510 which is described in greater detail above with regard to FIG. 5.

At operation 620, the solder connections 140 are formed on the photonic die (e.g., the photonic die 110, 310, or 410). In one embodiment, forming the solder connections 140 includes forming I/O pads on a bottom surface (e.g., the surface 112, 312, or 412) of a photonic die and forming solder bumps 142 on each of the I/O pads 141.

At operation 630, the photonic assembly is tested. For example, the photonic assembly may be tested for optical performance and/or electrical performance. In one embodiment, testing the photonic assembly for electrical performance tests the electrical connections between the various elements of the photonic assembly. For example, with reference to FIG. 1, testing the photonic assembly 102 for electrical performance tests the electrical connections between the optical device 120 and the photonic die 110. Further, with reference to FIG. 2, testing the photonic assembly 202 for electrical performance tests the electrical connections between the EIC 220 and the photonic die 110. A photonic assembly may be considered to have an electrical fault when the electrical connection between one or more optical elements (e.g., the optical device 120) and the photonic die (e.g., the photonic die 110) is determined to be malfunctioning. For example, a malfunctioning electrical connection may one that is unable to support the communication of electrical signals between the one or more optical elements (e.g., the optical device 120) and the photonic die (e.g., the photonic die 110).

In various embodiments, testing the photonic assembly for optical performance tests the optical connections between the various elements of the photonic assembly. For example, with reference to FIG. 1, testing the photonic assembly 102 for optical performance tests the optical connections between the optical device 120 and the photonic die 110. Further, with reference to FIG. 2, testing the photonic assembly 202 for optical performance tests the optical connections between the EIC 220 and the photonic die 110. A photonic assembly may be considered to have an optical connection fault when the optical connection between one or more optical elements and the photonic die is determined to be malfunctioning. For example, a malfunctioning optical connection may be one that is unable to support the communication of optical signals between the one or more optical elements (e.g., the optical device 120) and the photonic die (e.g., the photonics die 110). In one embodiment, an optical connection fault may be due to a misalignment between an optical element (e.g., the optical device 120) and a photonic die (e.g., the photonic die 110).

In one or more embodiments, operation 620 may occur before the operation 630. Alternatively, the operation 620 may occur after the operation 630. Further, in one or more embodiments, the method 600 may include the operation of dicing a wafer to form the individual photonic assemblies (e.g., the photonic assembly 102, 202, 302, or 402). For example, the photonic die 110 may be part of a larger wafer, on which one or more optical devices are attached. After the optical devices are attached, the wafer may be diced to form individual photonic assemblies. In one embodiment, the solder bumps 142 are formed on the I/O pads 141 before the wafer is diced to form the individual photonic assemblies. Alternatively, the solder bumps 142 are formed on the I/O pads 141 may be formed after the wafer is diced to form the individual photonic assemblies. Further, after the wafer has been diced to form the individual photonic assemblies, the photonic assemblies may be tested as described in operation 630.

At operation 640, a photonic assembly (e.g., the photonic assembly 102, 202, 302, or 402) is attached to the substrate 150. For example, the photonic assembly may be attached to the substrate 150 via the solder connections 140. In one or more embodiments, the photonic assembly (e.g., the photonic assembly 102, 202, 302, or 402) is attached to the substrate 150 via the solder connections 140 by reflowing the solder connections 140. The solder connections 140 are reflowed at a temperature less than the cure temperature of the adhesive 130. In one embodiment, the solder connections are reflowed at a temperature less than about 160 degrees Celsius.

At operation 650, the solder of the solder connections 140 (e.g., the solder of the solder bumps 142) is converted to an intermetallic compound. In one embodiment, the entirety of the solder of each of the solder connections 140 may be converted to an intermetallic compound. In other embodiments, at least a portion of the solder of each of the solder connections 140 is converted to an intermetallic compound. For example, at least 50 percent of the solder of each of the solder connections 140 is converted to an intermetallic compound. In one embodiment, the solder of the solder connections 140 may be referred to as being a full intermetallic compound when at least 90 percent of the solder of each solder connections 140 is converted to a full intermetallic compound. In various embodiments, a first portion of the solder of the solder connections 140 is converted to an intermetallic compound when the solder bumps 142 are formed on the I/O pads 141. Further, a second portion of the solder of the solder connections 140 is converted to an intermetallic compound in response to the heating process used to cure the adhesive 130 to attach the optical device 120 with the photonic die 110. A third portion of the solder of the solder connections 140 is converted to an intermetallic compound in response to the reflow process used to attach the photonic assembly (e.g., the photonic assembly 102, 202, 302, or 402) to the substrate 150. Finally, a fourth portion of the solder of the solder connections 140 is converted to an intermetallic compound in response to a heating (or annealing process) as described in operation 650.

In one embodiment, converting the solder to an intermetallic compound includes heating the photonic device (e.g., the photonic device 100, 300, 400) at a temperature less than the reflow temperature of the solder connections 140, and less than cure temperature of the adhesive 130 for a period of time. In various embodiments, heating the photonic device includes heating a corresponding photonic assembly (e.g., the photonic assembly 102, 202, 302, or 402) and substrate (e.g., the substrate 150). The temperature may be in a range of about 100 degrees Celsius to about 120 degrees Celsius. However, in other embodiments, the temperature may be less than about 100 degrees Celsius or greater than about 120 degrees Celsius. Further, the period of time may be in a range of about 1 hour to about 3 hours. However, in other embodiments, periods of time that are less than about 1 hour or greater than about 3 hours may be utilized. In various embodiments, converting the solder of the solder connections 140 to an intermetallic compound mitigates the risk of the solder bumps 142 from re-melting during the manufacturing process as the conversion reduces the risk of the solder bumps 142 from re-melting. Accordingly, the chance for disconnections occurring between the photonic assembly (e.g., the photonic assembly 102, 202, 302, or 402) and the substrate 150 may be mitigated.

In the current disclosure, reference is made to various embodiments. However, the scope of the present disclosure is not limited to specific described embodiments. Instead, any combination of the described features and elements, whether related to different embodiments or not, is contemplated to implement and practice contemplated embodiments. Additionally, when elements of the embodiments are described in the form of "at least one of A and B," it will be understood that embodiments including element A exclusively, including element B exclusively, and including element A and B are each contemplated. Furthermore, although some embodiments disclosed herein may achieve advantages over other possible solutions or over the prior art, whether or not a particular advantage is achieved by a given embodiment is not limiting of the scope of the present disclosure. Thus, the aspects, features, embodiments and advantages disclosed herein are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

As will be appreciated by one skilled in the art, the embodiments disclosed herein may be embodied as a system, method or computer program product. Accordingly, embodiments may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, embodiments may take the form of a computer program product embodied in one or more computer readable medium(s) having computer readable program code embodied thereon.

Program code embodied on a computer readable medium may be transmitted using any appropriate medium, including but not limited to wireless, wireline, optical fiber cable, RF, etc., or any suitable combination of the foregoing.

Computer program code for carrying out operations for embodiments of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present disclosure are described herein with reference to flowchart illustrations and/or block diagrams of methods, apparatuses (systems), and computer program products according to embodiments presented in this disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the block(s) of the flowchart illustrations and/or block diagrams.

These computer program instructions may also be stored in a computer readable medium that can direct a computer, other programmable data processing apparatus, or other device to function in a particular manner, such that the instructions stored in the computer readable medium produce an article of manufacture including instructions which implement the function/act specified in the block(s) of the flowchart illustrations and/or block diagrams.

The computer program instructions may also be loaded onto a computer, other programmable data processing apparatus, or other device to cause a series of operational steps to be performed on the computer, other programmable apparatus or other device to produce a computer implemented process such that the instructions which execute on the computer, other programmable data processing apparatus, or other device provide processes for implementing the functions/acts specified in the block(s) of the flowchart illustrations and/or block diagrams.

The flowchart illustrations and block diagrams in the Figures illustrate the architecture, functionality, and operation of possible implementations of systems, methods, and computer program products according to various embodiments. In this regard, each block in the flowchart illustrations or block diagrams may represent a module, segment, or portion of code, which comprises one or more executable instructions for implementing the specified logical function(s). It should also be noted that, in some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustrations, and combinations of blocks in the block diagrams and/or flowchart illustrations, can be implemented by special purpose hardware-based systems that perform the specified functions or acts, or combinations of special purpose hardware and computer instructions.

In view of the foregoing, the scope of the present disclosure is determined by the claims that follow.

We claim:

1. A method for forming a photonic device, the method comprising:
   forming a photonic assembly by curing an optically clear adhesive at a cure temperature to attach an optical device to a photonic die to form an optical connection between the optical device and the photonic die; and
   attaching the photonic assembly to a substrate by reflowing one or more solder connections formed between the photonic assembly and the substrate, wherein a reflow temperature of the one or more solder connections is less than the cure temperature of the optically clear adhesive.

2. The method of claim 1, wherein attaching the optical device to the photonic die comprises aligning an optical fiber array to the photonic die.

3. The method of claim 2 further comprising attaching a laser to the photonic die.

4. The method of claim 1 further comprising at least one of electrically testing and optically testing the photonic assembly before attaching the photonic assembly to the substrate.

5. The method of claim 1 further comprising heating the photonic assembly and the substrate at a temperature less than the reflow temperature to convert solder of the one or more solder connections to an intermetallic compound, wherein reflowing the one or more solder connections includes reflowing the one or more solder connections at the reflow temperature.

6. The method of claim 1, wherein the cure temperature of the optically clear adhesive is less than about 160 degrees Celsius.

7. The method of claim 1 further comprising disposing solder bumps on the photonic die to form the one or more solder connections, wherein the solder bumps comprise of one of In49Sn, SnIn52, In, SnBi58, In-3Ag, In90Sn10, and In67Bi.

8. A photonic device, comprising:
 a photonic assembly comprising:
  a photonic die;
  an optical device coupled to the photonic die with an optically clear adhesive to form an optical connection between the optical device and the photonic die, wherein the optically clear adhesive is cured at a cure temperature to couple the optical device with the photonic die; and
  a plurality of solder connections having a reflow temperature less than the cure temperature of the optically clear adhesive; and
 a substrate coupled to the photonic assembly by the plurality of solder connections.

9. The photonic device of claim 8, wherein the optical device is an optical fiber array.

10. The photonic device of claim 9, wherein the photonic assembly further comprises a laser coupled to the photonic die.

11. The photonic device of claim 8, wherein each of the plurality of solder connections comprises an intermetallic compound formed by heating the photonic assembly and the substrate at a temperature less than the reflow temperature.

12. The photonic device of claim 8, wherein the cure temperature of the optically clear adhesive is less than about 160 degrees Celsius.

13. The photonic device of claim 8, wherein the solder connections comprise solder bumps comprised of one of In49Sn, SnIn52, In, SnBi58, In-3Ag, In90Sn10, and In67Bi.

14. A photonic assembly, comprising:
 a photonic die;
 an optical device coupled to the photonic die with an optically clear adhesive to form an optical connection between the optical device and the photonic die, wherein the optically clear adhesive is cured at a cure temperature to couple the optical device with the photonic die; and
 a first plurality of solder connections having a reflow temperature less than the cure temperature of the optically clear adhesive.

15. The photonic assembly of claim 14, wherein the optical device is an optical fiber array.

16. The photonic assembly of claim 15, wherein the photonic assembly further comprises a laser coupled to the photonic die.

17. The photonic assembly of claim 14, wherein the photonic die includes at least one of an integrated circuit and a mold compound.

18. The photonic assembly of claim 14, wherein the cure temperature of the optically clear adhesive is less than about 160 degrees Celsius.

19. The photonic assembly of claim 14, further comprising an integrated circuit coupled to the photonic die by a second plurality of solder connections having a reflow temperature greater than the reflow temperature of the first plurality of solder connections.

20. The photonic assembly of claim 14, wherein the first plurality of solder connections comprise solder bumps comprised of one of In49Sn, SnIn52, In, SnBi58, In-3Ag, In90Sn10, and In67Bi.

* * * * *